US012591963B2

(12) United States Patent
Kolchin

(10) Patent No.: US 12,591,963 B2
(45) Date of Patent: Mar. 31, 2026

(54) SYSTEM AND METHOD FOR ENHANCING DEFECT DETECTION IN OPTICAL CHARACTERIZATION SYSTEMS USING A DIGITAL FILTER

(71) Applicant: KLA Corporation, Milpitas, CA (US)

(72) Inventor: Pavel Kolchin, Livermore, CA (US)

(73) Assignee: KLA Corporation, Milpitas, CA (US)

( * ) Notice: Subject to any disclaimer, the term of this patent is extended or adjusted under 35 U.S.C. 154(b) by 363 days.

(21) Appl. No.: 17/986,620

(22) Filed: Nov. 14, 2022

(65) Prior Publication Data

US 2024/0161270 A1     May 16, 2024

(51) Int. Cl.
*G06V 10/30* (2022.01)
*G06T 7/00* (2017.01)
(Continued)

(52) U.S. Cl.
CPC .............. *G06T 7/001* (2013.01); *G06V 10/26* (2022.01); *G06V 10/30* (2022.01); *G06V 10/774* (2022.01);
(Continued)

(58) Field of Classification Search
CPC ........... G06T 7/001; G06T 2207/30148; G06T 7/0004; G06V 10/26; G06V 10/30; G06V 10/774; H01L 21/67288
See application file for complete search history.

(56) References Cited

U.S. PATENT DOCUMENTS 9,734,422 B2     8/2017 Kolchin et al.
2016/0140412 A1* 5/2016 Kolchin .................. G06T 7/001
382/260

(Continued)

FOREIGN PATENT DOCUMENTS

CN          105891215 B   *   1/2019   ......... G01N 21/8851
KR     1020160090434 A       8/2016

OTHER PUBLICATIONS

Lomonaco, V. (Sep. 21, 2018). Why continual learning is the key towards Machine Intelligence. Medium. https://medium.com/continual-ai/why-continuous-learning-is-the-key-towards-machine-intelligence-1851cb57c308 (Year: 2017).*

(Continued)

*Primary Examiner* — Xuemei G Chen
*Assistant Examiner* — Kyla Guan-Ping Tiao Allen
(74) *Attorney, Agent, or Firm* — Suiter Swantz IP

(57)          ABSTRACT

A system for enhancing defect detection in optical characterization systems using a digital filter is disclosed. The system may include a controller including one or more processors configured to execute a set of program instructions. The set of program instructions may be configured to cause the one or more processors to: acquire one or more sample images, the one or more sample images including one or more difference images, the one or more sample images including one or more photomask images, the one or more difference images including defect data; generate one or more filtered images by applying a digital filter to each of the one or more sample images, the digital filter including a convolution filter including one or more convolution filter coefficients; and adjust the applied digital filter using a machine learning classifier, the adjusted digital filter configured to enhance defect detection of an inspection subsystem.

20 Claims, 8 Drawing Sheets

(51) Int. Cl.

| | |
|---|---|
| *G06V 10/26* | (2022.01) |
| *G06V 10/774* | (2022.01) |
| *H01L 21/67* | (2006.01) |

(52) U.S. Cl.

CPC .............. *G06T 2207/30148* (2013.01); *H01L 21/67288* (2013.01)

(56) References Cited

U.S. PATENT DOCUMENTS

| | | | | |
|---|---|---|---|---|
| 2016/0163035 | A1 | 6/2016 | Chang et al. | |
| 2019/0073566 | A1* | 3/2019 | Brauer | G06V 10/776 |
| 2019/0121230 | A1 | 4/2019 | Ou | |
| 2019/0206041 | A1* | 7/2019 | Fang | G06T 7/001 |
| 2019/0318469 | A1* | 10/2019 | Wang | G06N 3/08 |
| 2020/0226722 | A1* | 7/2020 | Pandey | G06T 5/70 |
| 2020/0234428 | A1* | 7/2020 | George | G06N 3/082 |
| 2020/0380665 | A1 | 12/2020 | Horii | |
| 2021/0158223 | A1 | 5/2021 | Sezginer et al. | |
| 2023/0077332 | A1* | 3/2023 | Sano | G06T 7/70 |
| | | | | 382/149 |

OTHER PUBLICATIONS http://en.wikipedia.org/wiki/Matched_filter.

Mastorakis, N.E., "Multidimensional matched filters," Electronics, Circuits, and Systems, 1996. ICECS '96., Proceedings of the Third IEEE International Conference on , vol. 1, No., pp. 467,470 vol. 1, Oct. 13-16, 1996.

Korean Intellectual Property Office, International Search Report and Written Opinion received in International Application No. PCT/US2023/035942, Feb. 20, 2024, 8 pages.

* cited by examiner

200

202 — ACQUIRE ONE OR MORE SAMPLE IMAGES

204 — GENERATE ONE OR MORE FILTERED IMAGES BY APPLYING A DIGITAL FILTER TO THE ACQUIRED ONE OR MORE SAMPLE IMAGES

206 — ADJUST THE APPLIED DIGITAL FILTER USING A MACHINE LEARNING CLASSIFIER

206

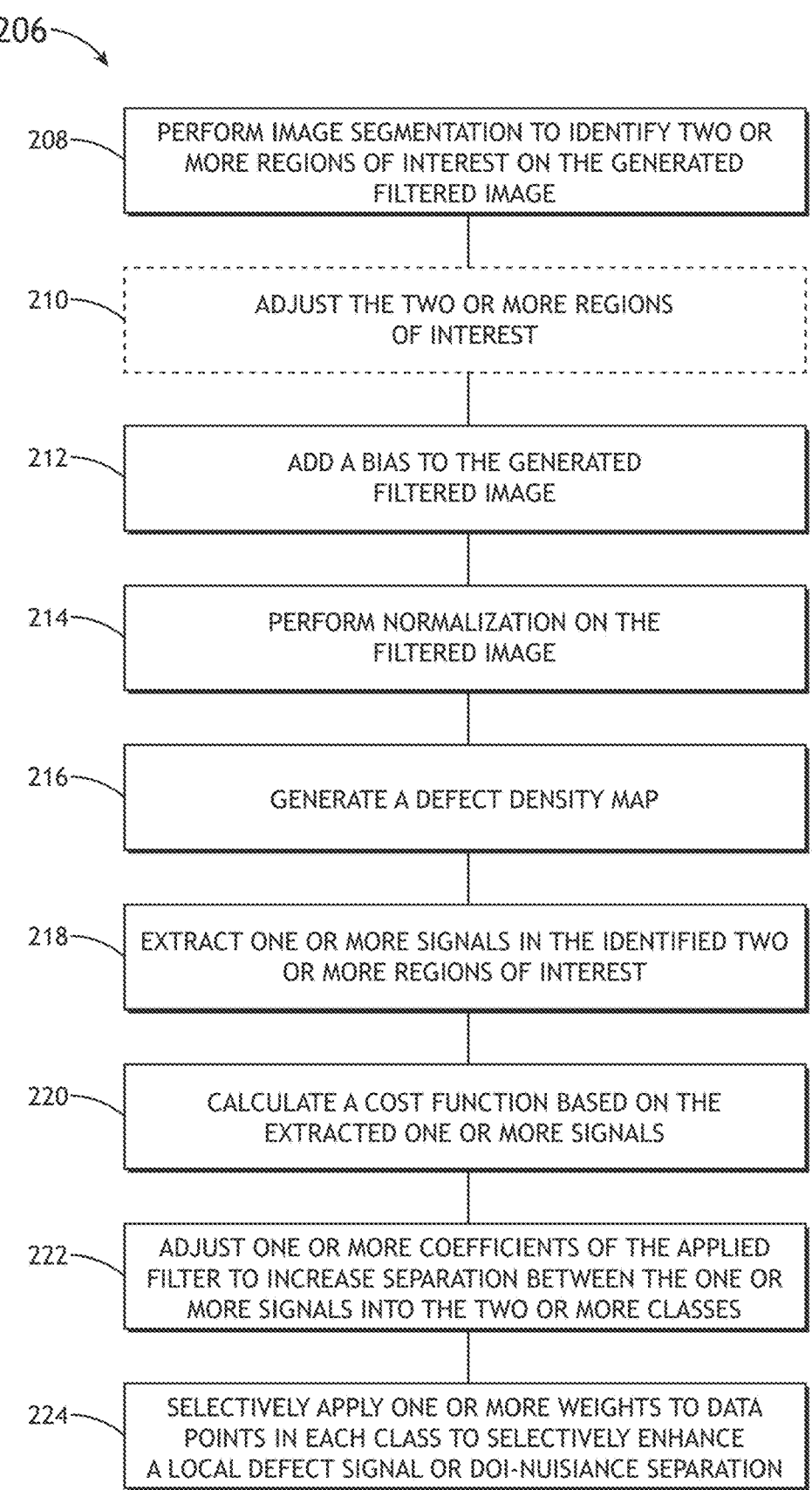

208 — PERFORM IMAGE SEGMENTATION TO IDENTIFY TWO OR MORE REGIONS OF INTEREST ON THE GENERATED FILTERED IMAGE

210 — ADJUST THE TWO OR MORE REGIONS OF INTEREST

212 — ADD A BIAS TO THE GENERATED FILTERED IMAGE

214 — PERFORM NORMALIZATION ON THE FILTERED IMAGE

216 — GENERATE A DEFECT DENSITY MAP

218 — EXTRACT ONE OR MORE SIGNALS IN THE IDENTIFIED TWO OR MORE REGIONS OF INTEREST

220 — CALCULATE A COST FUNCTION BASED ON THE EXTRACTED ONE OR MORE SIGNALS

222 — ADJUST ONE OR MORE COEFFICIENTS OF THE APPLIED FILTER TO INCREASE SEPARATION BETWEEN THE ONE OR MORE SIGNALS INTO THE TWO OR MORE CLASSES

224 — SELECTIVELY APPLY ONE OR MORE WEIGHTS TO DATA POINTS IN EACH CLASS TO SELECTIVELY ENHANCE A LOCAL DEFECT SIGNAL OR DOI-NUISIANCE SEPARATION

FIG.2B

SYSTEM AND METHOD FOR ENHANCING DEFECT DETECTION IN OPTICAL CHARACTERIZATION SYSTEMS USING A DIGITAL FILTER

TECHNICAL FIELD

The present invention generally relates to defect detection, and, more particularly, to a system and method enhancing defect detection in optical characterization systems using a digital filter.

BACKGROUND

As the demand for integrated circuits having ever-small device features continues to increase, the need for improved defect detection systems continues to grow. Current digital filter techniques used in current inspection systems are limited to a set of predefined digital filter templates. The limited number of digital filter options is insufficient for challenging inspection and/or defect detection settings. For example, this reduced set of filters is not sufficient to increase the detection sensitivity and reduce the nuisance rates. For instance, as defects become smaller, defect signal detection becomes more difficult because signal detection typically occurs at the edge or below the sensitivity limit of the optical inspection system. This results in increased noise and increased nuisance count rates. As such, it would be advantageous to provide system and method to remedy the shortcomings of the approaches identified above.

SUMMARY

A system is disclosed, in accordance with one or more embodiments of the present disclosure. In embodiments, the system includes an inspection sub-system. In embodiments, the system includes a controller communicatively coupled to the inspection sub-system, the controller including one or more processors configured to execute a set of program instructions stored in memory, the set of program instructions configured to cause the one or more processors to: acquire one or more sample images of a sample, the one or more sample images including one or more difference images, the one or more sample images including one or more photomask images, the one or more difference images including defect data; generate one or more filtered images by applying a digital filter to each of the one or more sample images, the digital filter including a convolution filter including one or more convolution filter coefficients; and adjust the applied digital filter using a machine learning classifier to generated an adjusted digital filter, the adjusted digital filter configured to enhance defect detection of the inspection sub-system.

A system is disclosed, in accordance with one or more embodiments of the present disclosure. In embodiments, the system includes a controller including one or more processors configured to execute a set of program instructions stored in memory, the set of program instructions configured to cause the one or more processors to: acquire one or more sample images, the one or more sample images including one or more difference images, the one or more sample images including one or more photomask images, the one or more difference images including defect data; generate one or more filtered images by applying a digital filter to each of the one or more sample images, the digital filter including a convolution filter including one or more convolution filter coefficients; and adjust the digital filter using a machine learning classifier to generated an adjusted digital filter, the adjusted digital filter configured to enhance defect detection of an inspection sub-system.

A method is disclosed, in accordance with one or more embodiments of the present disclosure. In embodiments, the method includes acquiring one or more sample images, the one or more sample images including one or more difference images, the one or more sample images including one or more photomask images, the one or more difference images including defect data. In embodiments, the method includes generating one or more filtered images by applying a digital filter to each of the one or more sample images. In embodiments, the method includes adjusting the digital filter using a machine learning classifier, the adjusted digital filter configured to enhance defect detection of an inspection system.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

FIG. 2B illustrates a flow diagram depicting a method for adjusting the applied digital filter to generate an adjusted digital filter, in accordance with one or more embodiments of the present disclosure.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to a system and method for enhancing defect detection. In particular, embodiments of the present disclosure are directed to a system and method for enhancing defect detection in optical inspection systems using a digital filter. For example, the system may be configured to generate a convolutional filter and apply the generated convolutional filter to one or more difference images from a sample. For instance, the system may be configured to predict and apply the generated convolutional filter to increase the detection rate of defects of interest (DOI) and/or reduce the detection rate of nuisance events.

Figure 1A:
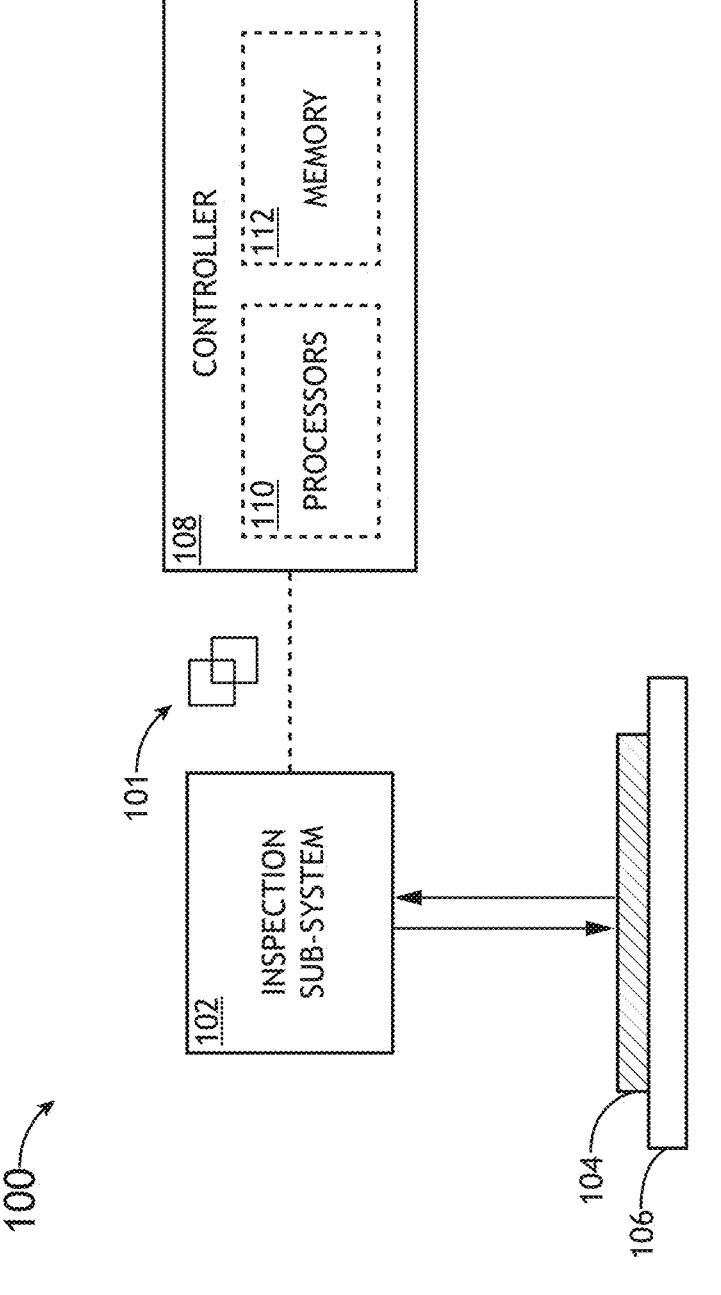
FIG. 1A illustrates a block diagram view of a system for enhanced defect detection using a digital filter, in accordance with one or more embodiments of the present disclosure.

FIG. 1A illustrates a simplified block diagram of a system 100 for enhancing defect detection, in accordance with one or more embodiments of the present disclosure.

In embodiments, the system 100 includes an inspection sub-system 102 configured to perform defect inspection of one or more samples 104. For example, the inspection sub-system 102 may be configured to acquire one or more inspection images 101 of one or more portions of the one or more samples 104.

It is noted that the inspection sub-system 102 may include any type of inspection sub-system 102 known in the art. For example, the inspection sub-system 102 may include an optical-based inspection tool such as, but is not limited to, a bright-field inspection sub-system, a dark-field inspection system, or the like. The one or more samples 104 may include any sample known in the art including, but not limited to, a wafer, a reticle/photomask, and the like.

In embodiments, the one or more samples 104 are disposed on the sample stage assembly 106 to facilitate movement of the one or more samples 104. The sample stage assembly 106 may include any sample stage assembly 106 known in the art including, but not limited to, an X-Y stage, an R-θ stage, and the like. In embodiments, the sample stage assembly 106 is capable of adjusting the height of the one or more samples 104 during inspection or imaging to maintain focus on the one or more samples 104.

In embodiments, the system 100 includes a controller 108 communicatively coupled to the inspection sub-system 102. The controller 108 includes one or more processors 110 configured to execute program instructions maintained on a memory medium 112 (memory 112). The one or more processors 110 of the controller 108 may execute any of the various process steps described throughout the present disclosure. For example, the one or more processors 110 may be configured to generate a digital filter 113 and store the digital filter 113 in memory 112, as discussed further herein. For instance, the one or more processors 110 may be configured to generate the digital filter 113 using a machine learning classifier 115 stored in memory 112. By way of another example, the one or more processors 110 may be configured to retrieve the digital filter 113 from memory 112 and apply the generated digital filter 113 to one or more difference images of the one or more samples 104, as discussed further herein. Further, the one or more processors 110 of the controller 108 may be configured to receive data including, but not limited to, imagery data associated with the one or more samples 104 from the inspection sub-system 102 (or an external characterization tool).

In embodiments, the adjusted digital filter 113 may be used inline during the inspection. For example, in this case, the adjusted digital filter 113 may be convolved with the image that is coming out the imaging sensor (e.g., TDI) before the detection algorithm is applied.

In embodiments, the adjusted digital filter 113 may be used post-detection. For example, in this case, the adjusted digital filter 113 may be applied to each image patch of the detected defect in the lot result to calculate the attributes. The attributes may be calculated as maximum signals extracted in defect and noise regions from each filtered image in the lot result. The adjusted digital filter attributes may then be used together with other available attributes in the inspection system to filter DOIs against Nuisances.

In embodiments, multiple adjusted digital filters 113 with multiple attributes may be generated. For example, multiple digital adjusted filters 113 with multiple attributes may be generated by training different filters with different training sets (e.g. DOI Type A vs. nuisance Type A (attribute A), DOI Type B vs. nuisance Type B (attribute B)).

Figure 1B:
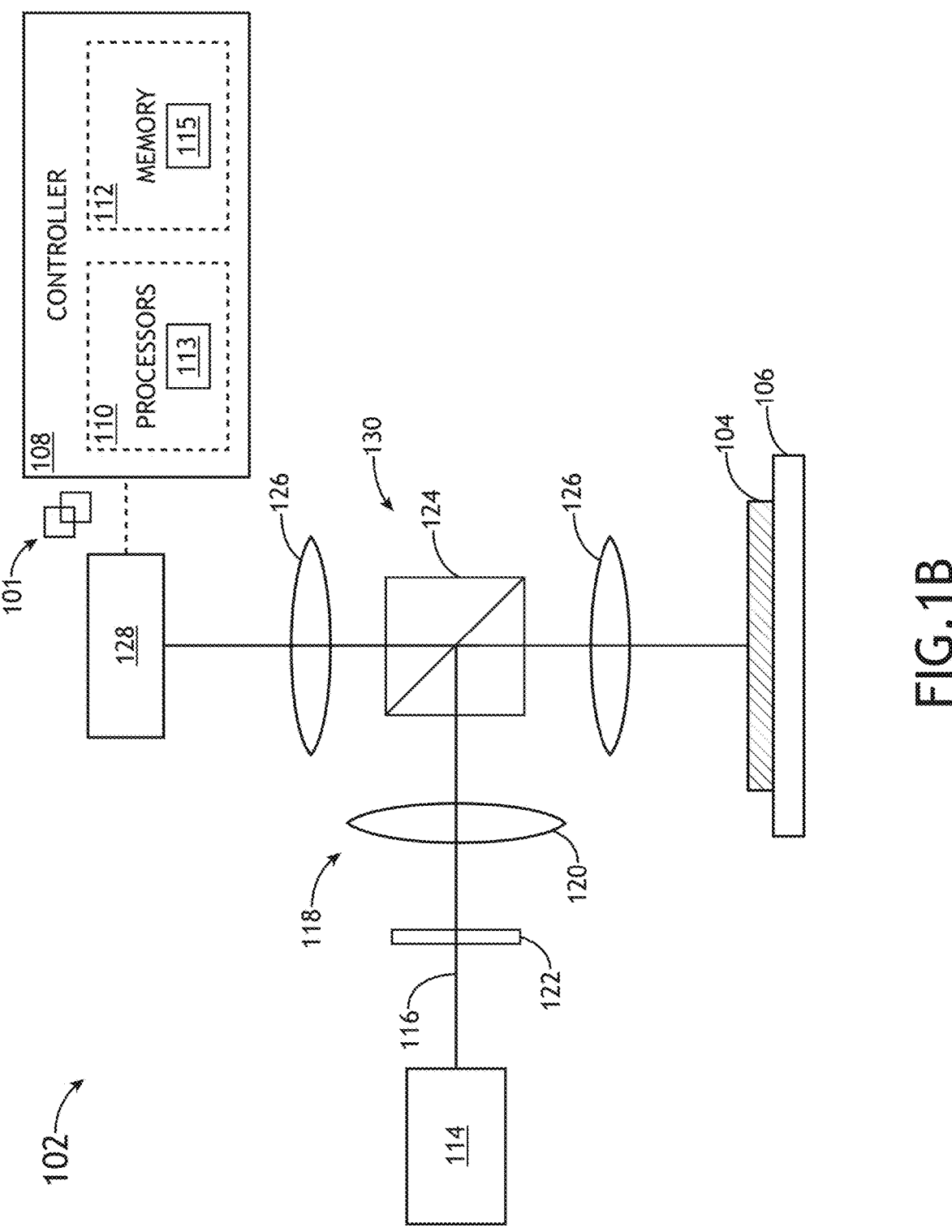
FIG. 1B illustrates a simplified schematic view of an inspection sub-system of the system, in accordance with one or more embodiments of the present disclosure.

FIG. 1B illustrates a simplified schematic of the inspection sub-system 102, in accordance with one or more embodiments of the present disclosure.

In embodiments, the inspection sub-system 102 includes an illumination source 114 to generate an illumination beam 116. The illumination beam 116 may include one or more selected wavelengths of light including, but not limited to, ultraviolet (UV) radiation, visible radiation, or infrared (IR) radiation.

In embodiments, the illumination source 114 directs the illumination beam 116 to the sample 104 via an illumination pathway 118. The illumination pathway 118 may include one or more lenses 120. Further, the illumination pathway 118 may include one or more additional optical components 122 suitable for modifying and/or conditioning the illumination beam 116. For example, the one or more optical components 122 may include, but are not limited to, one or more polarizers, one or more filters, one or more beam splitters, one or more diffusers, one or more homogenizers, one or more apodizers, or one or more beam shapers.

In embodiments, the illumination pathway 118 includes a beamsplitter 124. In embodiments, the inspection sub-system 102 includes an objective lens 126 to focus the illumination beam 116 onto the sample 104.

In embodiments, the inspection sub-system 102 includes one or more detectors 128 configured to capture radiation emanating from the sample 104 through a collection pathway 130. The collection pathway 130 may include multiple optical elements to direct and/or modify illumination collected by the objective lens 126 including, but not limited to one or more lenses, one or more filters, one or more polarizers, one or more beam blocks, or one or more beamsplitters. For example, the detector 128 may receive an image of the sample 104 provided by elements in the collection pathway 130 (e.g., the objective lens 126, the one or more lenses, or the like). By way of another example, the detector 128 may receive radiation reflected or scattered (e.g., via specular reflection, diffuse reflection, and the like) from the sample 104. By way of another example, the detector 128 may receive radiation generated by the sample (e.g., luminescence associated with absorption of the illumination beam 116, and the like). Further, it is noted herein that the one or more detectors 128 may include any optical detector known in the art suitable for measuring illumination received from the sample 104. For example, the detector 128 may include, but is not limited to, a charge coupled device (CCD) detector, a time delay and integration (TDI) detector, a photomultiplier tube (PMT), an avalanche photodiode (APD), or the like.

Figure 2A:
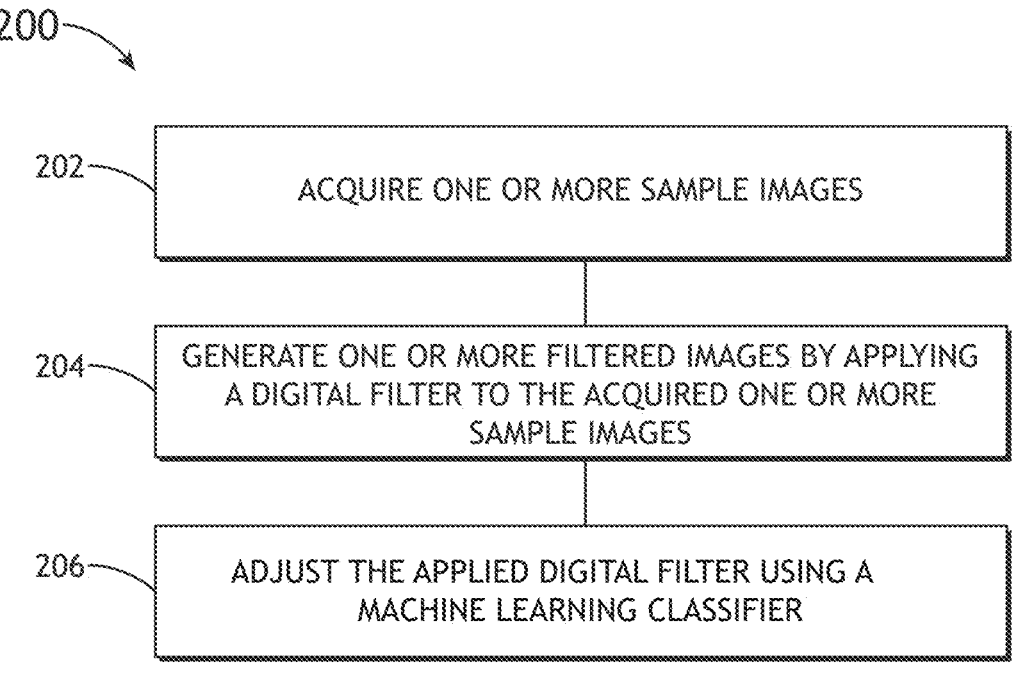
FIG. 2A illustrates a flow diagram depicting a method for enhancing defect detection using a digital filter, in accordance with one or more embodiments of the present disclosure.
Figure 3:
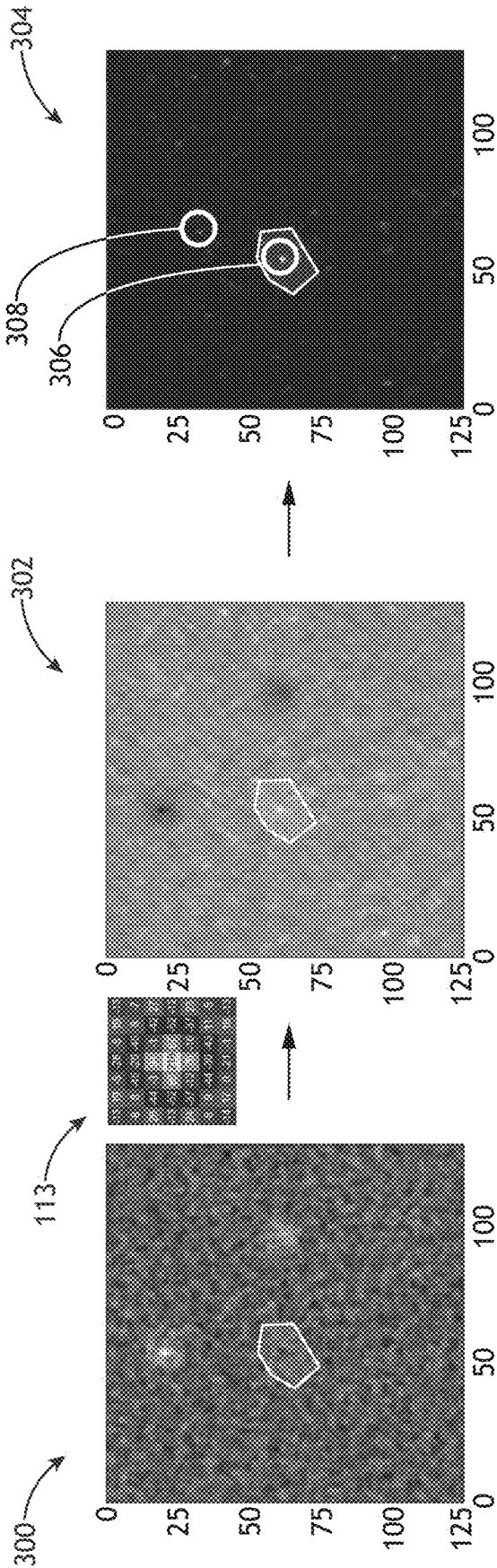
FIG. 3 illustrates a process flow diagram depicting a method for enhancing defect detection using a digital filter, in accordance with one or more embodiments of the present disclosure.

FIG. 2A illustrates a flow diagram for a method 200 of enhancing defect detection, in accordance with one or more embodiments of the present disclosure. It is noted herein that the steps of the method 200 may be implemented all or in part by the system 100. It is further recognized, however, that the method 200 is not limited to the system 100 in that additional or alternative system-level embodiments may carry out all or part of the steps of the method 200. FIG. 3 illustrates a process flow diagram of enhancing defect detection, in accordance with one or more embodiments of the present disclosure In a step 202, one or more samples images may be acquired. For example, the controller 108 may be configured to acquire one or more difference images (such as difference image 300 shown in FIG. 3). In embodiments, the controller 108 may be configured to generate one or more difference images based on two or more inspection images acquired from the inspection sub-system 102. For example, the controller 108 may be configured to calculate the difference between the two or more inspection images by finding the difference between each pixel in each image, and generating one or more difference images based on the result. In embodiments, the controller 108 may be configured to receive one or more difference images from a remote database or external sub-system. For example, an external sub-system may be configured to generate the one or more difference images based on two or more inspection images and provide the generated one or more difference images to the controller 108.

In a step 204, one or more filtered images may be generated. For example, the controller 108 may be configured to generate one or more filtered images (such as filtered image 302 shown in FIG. 3) by applying a convolution filter 113 to the one or more acquired difference images. For instance, the controller 108 may be configured to convolve the one or more acquired difference images with the convolution filter 113 stored in memory 112. It is noted herein that the convolution of the unfiltered defect image and the convolution filter may be carried out using any image convolution procedure known in the art.

In a step 206, the applied digital filter may be adjusted using a machine learning classifier. For example, the controller 108 may be configured to optimize (e.g., adjust until a predetermined quality threshold is met) the applied digital filter 113 using a machine learning classifier 115 stored in memory 112 to enhance defect detection of one of a DOI or a nuisance event. For instance, the controller 108, using the machine learning classifier 115, may be configured to adjust the applied digital filter 113 using a binary logistic regression model, as discussed further herein.

FIG. 2B illustrates a flow diagram for a method 206 of adjusting the applied digital filter 113 using the machine learning classifier 115, in accordance with one or more embodiments of the present disclosure. It is noted herein that the steps of the method 206 may be implemented all or in part by the system 100. It is further recognized, however, that the method 206 is not limited to the system 100 in that additional or alternative system-level embodiments may carry out all or part of the steps of the method 206.

In embodiments, the machine learning classifier is trained. For example, the controller 108 may be configured to train the machine learning classier 115 based on one or more acquired inspection images 101. For instance, the controller 108 may be configured to train the machine learning classifier 115 based on the defect data of the one or more inspection images 101. For example, the controller 108 may acquire one or more inspection images 101 from the inspection sub-system 102. By way of another example, the controller 108 may acquire one or more inspection images 101 from a remote database. In embodiments, the one or more inspection images 101 may include defect data. For example, the one or more inspection images 101 may include defect of interest (DOI) data. By way of another example, the one or more inspection images 101 may include nuisance event data.

In embodiments, the machine learning classifier 115 is continuously trained during operation of the system. For example, the controller 108 may be configured to train the machine learning classifier 115 based on one or more inspection images acquired during operation of the system 100 (e.g., during inspection of the sample 104).

The controller 108 may be configured to train the machine learning classifier 115 via any technique known in the art including, but not limited to, supervised learning, unsupervised learning, and the like. For example, in the context of supervised learning, the training images may include one or more inspection images including defect data (e.g., DOI data, nuisance event data, and the like) used to train the machine learning classifier. In this regard, the controller 108 may receive training inspection images. Accordingly, the training inspection images 101 and the defect data of the inspection images 101 may be used as inputs to train the machine learning classifier 115.

It is further noted herein that the machine learning classifier 115 may include any type of machine learning algorithm/classifier and/or deep learning technique or classifier known in the art including, but not limited to, a random forest classifier, a support vector machine (SVM) classifier, an ensemble learning classifier, an artificial neural network (ANN), and the like. By way of another example, the machine learning classifier may include a deep convolutional neural network (CNN). For instance, in some embodiments, the machine learning classifier may include ALEXNET and/or GOOGLENET. In this regard, the machine learning classifier may include any algorithm, classifier, or predictive model configured to adjust a digital filter, as will be discussed in further detail herein.

In a step 208, image segmentation may be performed to identify two or more regions of interest. For example, the controller 108, using the trained machine learning classifier 115, may be configured to perform image segmentation on the generated filtered image to identify two or more regions of interest on the generated filtered image. For instance, as shown in FIG. 3, the controller 108 may be configured to perform image segmentation to divide each filtered image into a defect region 306 and a noise region 308 using dilated detection spot extracted from the mask image. In this regard, the highest bit of the mask image may define the pixels where the defect is detected. This detection spot is dilated by a predefined number of pixels (e.g., 3, by default) in the x- and y-direction to create the defect region. Additionally, sample (e.g., wafer) structure region information encoded in lower bits of the mask image can be also used to further refine defect and noise regions.

In an optional step 210, the divided two or more regions of interest may be adjusted. For example, the controller 108, using the trained machine learning classifier, may be configured to adjust one of the noise region or the defect region using region information encoded in the bits of the mask image.

In a step 212, a bias may be added. For example, the controller 108, using the trained machine learning classifier, may be configured to add a bias to the generated filtered image (generated in step 208).

In a step 214, the filtered image may be normalized. For example, the controller 108, using the trained machine learning classifier, may be configured to normalize the defect signals of the filtered image. For instance, the controller 108, using the trained machine learning classifier, may be configured to apply a sigmoid function to the filtered image with the added bias.

In a step 216, a defect density map may be generated. For example, the controller 108, using the trained machine learning classifier, may be configured to generate a defect density map by applying a soft thresholding function.

In a step 218, maximum signal values from the divided two or more regions may be extracted from each filtered image using the generated defect density map. For example, the controller 108, using the trained machine learning classifier 115, may be configured to extract the maximum signal values from the two or more regions of the filtered image using the generated defect density map.

In a step 220, a cost function may be calculated based on the extracted one or more signals. For example, the controller 108, using the trained machine learning classifier, may be configured to calculate a cost function to adjust the digital filter.

The cost function may be shown and described by Equation 1:

$$\text{Cost} = - \sum_{\substack{Nuisance+ \\ Loc\ Noise}} w_i \log(1 - P_i) - \sum_{DOI} \log P_i \qquad \text{Equation 1}$$

In Equation 1, $w_i$ is the weight of the defect and $P_i$ is the normalized signal after filtering.

In embodiments, the cost function is be configured to classify the extracted maximum signal values into two or more classes. For example, the controller 108, using the trained machine learning classifier, may be configured to classify the extracted maximum signal values into two or more classes using the cost function (Equation 1). In one instance, the maximum signal values may be classified as a positive class if the signal is a DOI signal. In another instance, the maximum signal values may be classified as a negative class if the signal is a nuisance signal. In one instance, the maximum signal values may be classified as a negative class if the signal is a surrounding noise event.

In a step 222, the digital filter is adjusted to increase the separation between the signals in the positive and negative classes. For example, the controller 108, using the trained machine learning classifier, may be configured to adjust one of the difference image filter coefficients or the bias coefficient using a stochastic gradient descent method to minimize the cost function (Eqn. 1 shown and described above). In this regard, the adjusted image filter coefficients and/or bias coefficients may increase separation of the filtered DOI and nuisance/noise signals. This improvement may be evaluated using receiver operating characteristic (ROC) curves.

Figure 4A:
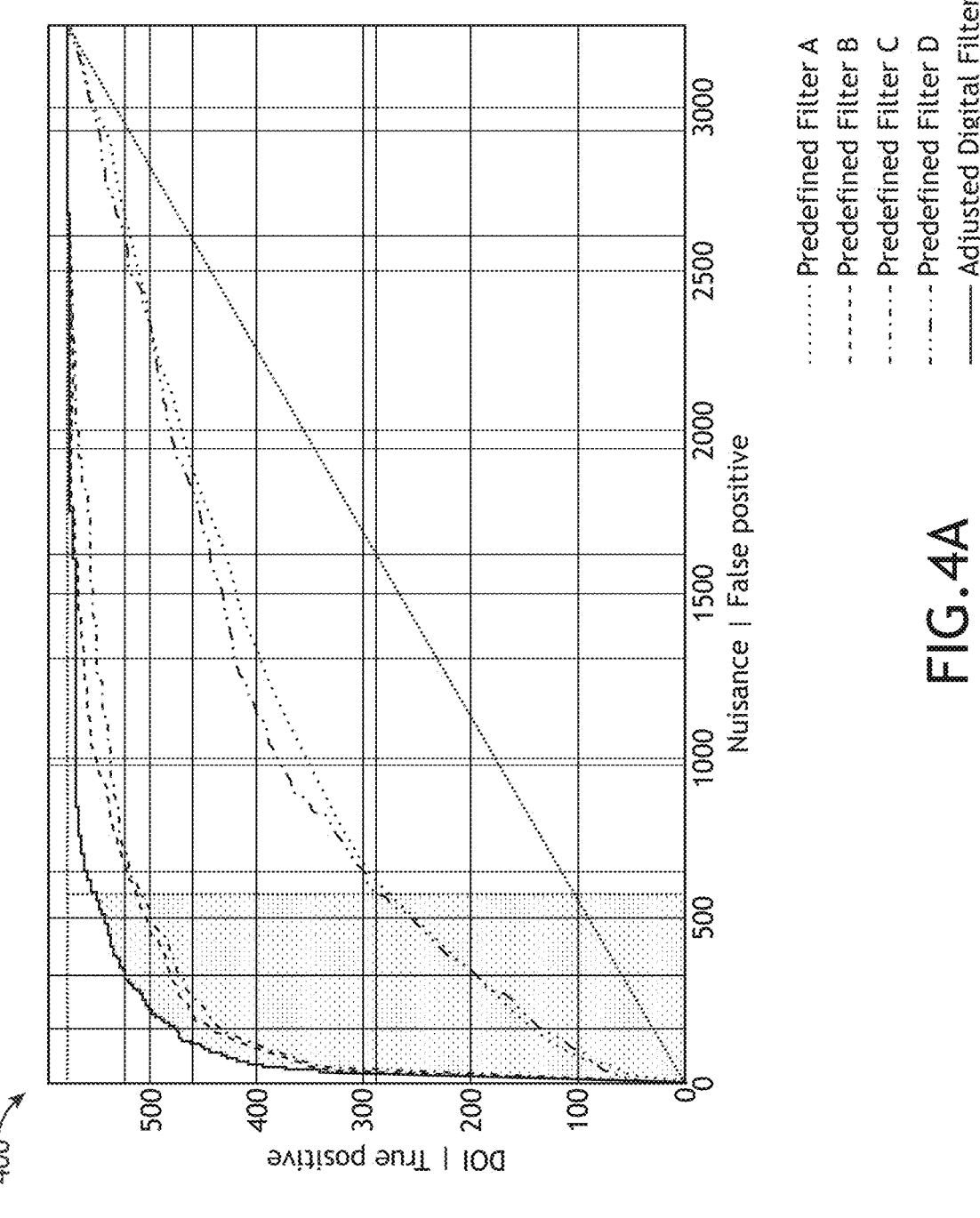
FIG. 4A illustrates a receive operating characteristic curve, in accordance with one or more embodiments of the present disclosure.
Figure 4B:
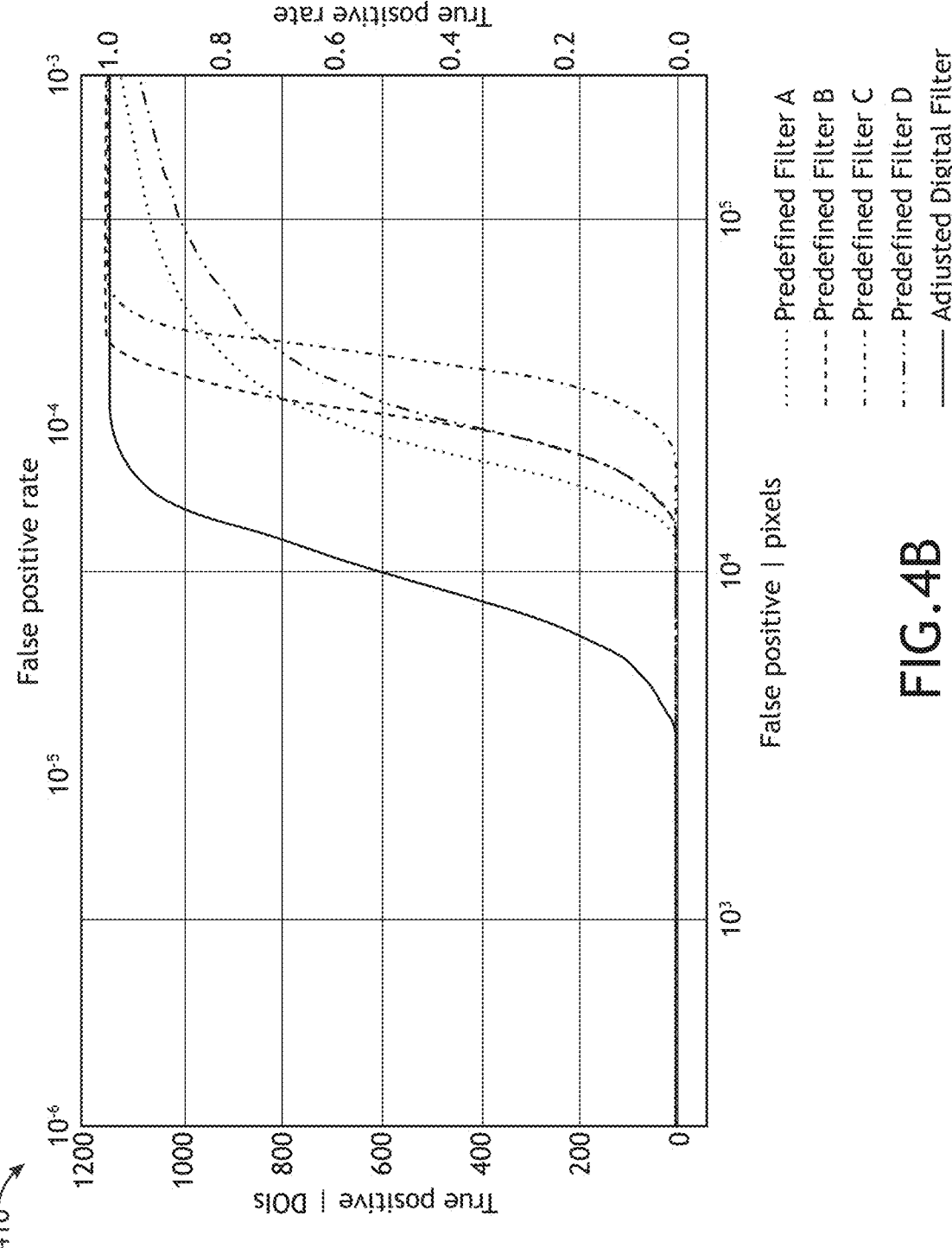
FIG. 4B illustrates a pixel-based receive operating characteristic curve, in accordance with one or more embodiments of the present disclosure.

FIGS. 4A-4B illustrate example ROC curves 400, 410, in accordance with one or more embodiments of the present disclosure. In particular, FIG. 4A illustrates a traditional ROC curve 400 comparing the performance of an adjusted (or optimized) digital filter and one or more predefined digital filters, in accordance with one or more embodiments of the present disclosure. In particular, FIG. 4B illustrates a pixel-based ROC curve 410 comparing the performance of an adjusted (or optimized) digital filter and one or more predefined digital filters, in accordance with one or more embodiments of the present disclosure.

Referring to FIG. 4A, in embodiments, the traditional ROC curve 400 depicts the number of true positive events (e.g., detected DOIs) along the y-axis and false positive events (e.g., detected nuisances) along the x-axis after applying a digital filter to the defect images. In this regard, the traditional ROC curve 400 may be used to compare the performance of the adjusted (or optimized) digital filter against the performance of one or more predefined digital filters (e.g., Filters A-D shown in FIG. 4A). As such, the separation between DOIs and nuisance may be evaluated using the traditional ROC curve 400.

Referring to FIG. 4B, in embodiments, the pixel-based ROC curve 410 depicts the number of true positive events (e.g., log scale of detected noise pixels) along the y-axis and false positive events (e.g., number of pixels in the noise region) along the x-axis after applying a digital filter to the defect images. It is noted that the number of pixels in the noise regions accumulated across all inspection images with signals above the threshold may be defined as the number of false positives (as shown along the x-axis). In this regard, the pixel-based ROC curve 410 may be used to compare the performance of the adjusted (or optimized) digital filter against the performance of one or more predefined digital filters (e.g., Filters A-D shown in FIG. 4B). As such, the separation between DOIs and nuisance may be evaluated using the pixel-based ROC curve 410.

In an optional step 224, the weights may be additionally applied to data points in each class in order to favor either local defect signal enhancement or DOI-nuisance separation. For example, data points of Eqn. 1 (shown and described above) may be adjusted to favor one of local defect signal enhancement or DOI-nuisance separation. For instance, weights ($w_i$) may be rebalanced within the negative class (across noise or nuisance events) in order enhance contribution of the local noise or nuisances. In this regard, enhancing contribution of the local noise may favor local defect signal enhanced and enhancing contribution of the nuisances may favor DOI-nuisance separation.

Figures 5A, 5B, 5C:
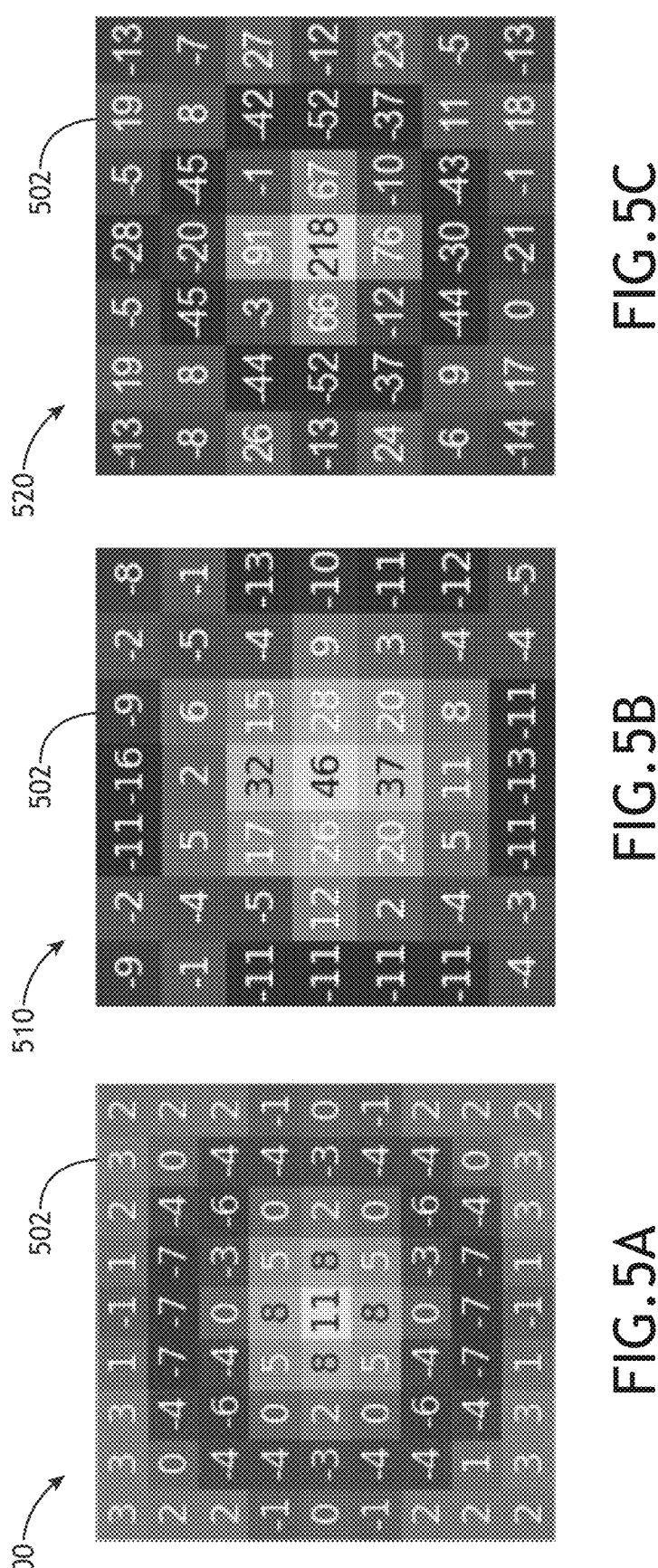
FIG. 5A illustrates a digital filter, in accordance with one or more embodiments of the present disclosure.
FIG. 5B illustrates a digital filter, in accordance with one or more embodiments of the present disclosure.
FIG. 5C illustrates a digital filter, in accordance with one or more embodiments of the present disclosure.

FIGS. 5A-5C illustrate digital filters, in accordance with one or more embodiments of the present disclosure. In particular, FIG. 5A depicts a digital filter 500, in accordance with one or more embodiments of the present disclosure. In particular, FIG. 5B depicts a digital filter 510, in accordance with one or more embodiments of the present disclosure. In particular, FIG. 5C depicts a digital filter 520, in accordance with one or more embodiments of the present disclosure.

In embodiments, the generated adjusted digital filter 113 includes an adjusted convolutional filter 500-520. For example, the adjusted convolutional filter 500-520 may include a matrix of a set of convolution filter coefficients 502. In one instance, as shown in FIG. 5A, the single convolutional filter 500 may include a 9×9 matrix of convolution filter coefficients 502. In another instance, as shown in FIGS. 5B-5C, the single convolutional filter 510, 520 may include a 7×7 matrix of convolution filter coefficients 502. It is noted that the single convolutional filter may include any configuration of convolution filter coefficients. FIGS. 5A-5C are provided merely for illustrative purposes and shall not be construed as limiting the scope of the present disclosure.

In embodiments, the system 100 is configured to adjust the convolution filter coefficients 502 to generate the adjusted digital filter 113. For example, the controller 108, using the trained machine learning classifier 115, may be configured to adjust the set of filter coefficients to generate an adjusted digital filter 113 (e.g., matrix of adjusted coefficients), then the adjusted convolution filter 500-520 (e.g., matrix of adjusted coefficients) may be convolved with the difference image in order to enhance defect signal and suppress one of local noise signals or nuisance signals.

Referring again to FIGS. 1A-1B, the one or more processors 110 of controller 108 may include any processing element known in the art. In this sense, the one or more processors 110 may include any microprocessor-type device configured to execute algorithms and/or instructions. In one embodiment, the one or more processors 110 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 112. Therefore, the above description should not be interpreted as a limitation on the present invention but merely an illustration.

The memory medium 112 may include any storage medium known in the art suitable for storing program instructions executable by the associated one or more processors 110. By way of a non-limiting example, the memory medium 112 may include a non-transitory memory medium. By way of additional non-limiting examples, the memory medium 112 may include, but is not limited to, a read-only memory (ROM), a random-access memory (RAM), a magnetic or optical memory device (e.g., disk), a magnetic tape, a solid-state drive (SSD), and the like. It is further noted that the memory 112 may be housed in a common controller housing with the one or more processors 110. In an alternative embodiment, the memory 112 may be located remotely with respect to the physical location of the one or more processors 110 and controller 108. For instance, the one or more processors 110 of the controller 108 may access a remote memory (e.g., server), accessible through a network (e.g., internet, intranet and the like).

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include, but not be limited to, systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, the system comprising:

an inspection sub-system; and a controller communicatively coupled to the inspection sub-system, the controller including one or more processors configured to execute a set of program instructions stored in memory, the set of program instructions configured to cause the one or more processors to:

acquire two or more sample images of a sample, wherein one or more difference images are generated by calculating pixel-by-pixel differences between the two or more sample images acquired, the two or more sample images including two or more photomask images, the one or more difference images including defect data;

generate one or more filtered images by applying a digital filter to each of the one or more difference images, the digital filter including a convolution filter including one or more convolution filter coefficients; and adjust the one or more convolution filter coefficients of the applied digital filter using a machine learning classifier to generate an adjusted digital filter, the adjusted digital filter including one or more bias coefficients and one or more adjusted convolution filter coefficients configured to enhance defect detection of the inspection sub-system by enhancing defect signals and suppressing at least one of noise signals or nuisance signals, wherein the machine learning classifier is continuously trained in real-time during operation of the system using inspection data to further update the one or more adjusted convolution filter coefficients and the one or more bias coefficients to increase separation between the defect signals and at least one of the noise signals or the nuisance signals.

2. The system of claim 1, wherein the defect data includes one of defect of interest data or nuisance event data.

3. The system of claim 1, wherein the adjusting the applied digital filter using a machine learning classifier, the adjusted digital filter configured to enhance defect detection of the inspection sub-system comprises:

performing image segmentation on the generated one or more filtered images to identify two or more regions of interest.

4. The system of claim 3, wherein the two or more regions of interest include at least one of:

a defect of interest region or a noise region.

5. The system of claim 4, wherein the adjusting the applied digital filter using a machine learning classifier, the adjusted digital filter configured to enhance defect detection of the inspection sub-system further comprises:

adjusting the two or more regions of interest using one or more dilated detection spots extracted from the acquired one or more photomask images.

6. The system of claim 4, wherein the adjusting the applied digital filter using a machine learning classifier, the adjusted digital filter configured to enhance defect detection of the inspection sub-system comprises:

performing normalization on the generated one or more filtered images.

7. The system of claim 5, wherein the adjusting the applied digital filter using a machine learning classifier, the adjusted digital filter configured to enhance defect detection of the inspection sub-system comprises:

extracting one or more signals in the two or more regions of interest.

8. The system of claim 7 wherein the adjusting the applied digital filter using a machine learning classifier, the adjusted digital filter configured to enhance defect detection of the inspection sub-system comprises:

calculating a cost function based on the extracted one or more signals to classify the extracted one or more signals into two or more classes.

9. The system of claim 8, wherein the adjusting the applied digital filter using a machine learning classifier, the adjusted digital filter configured to enhance defect detection of the inspection sub-system comprises:

selectively applying one or more weights to one or more data points to selectively enhance one of a local defect signal or a defect of interest-nuisance separation.

10. The system of claim 1, wherein the machine learning classifier comprises at least one of:

a deep learning classifier, a convolutional neural network (CNN), an ensemble learning classifier, a random forest classifier, or an artificial neural network.

11. The system of claim 1, wherein the sample includes a wafer.

12. The system of claim 1, wherein the set of program instructions are further configured to cause the one or more processors to:

apply the adjusted digital filter to an inspection image before a detection algorithm of the inspection sub-system is applied.

13. The system of claim 1, wherein the set of program instructions are further configured to cause the one or more processors to:

apply the adjusted digital filter to an inspection image after a detection algorithm of the inspection sub-system is applied.

14. A system, the system comprising:

a controller including one or more processors configured to execute a set of program instructions stored in memory, the set of program instructions configured to cause the one or more processors to:

acquire two or more sample images, wherein one or more difference images are generated by calculating pixel-by-pixel differences between the two or more sample images acquired, the two or more sample images including two or more photomask images, the one or more difference images including defect data, wherein the defect data includes one of defect of interest data or nuisance event data;

generate one or more filtered images by applying a digital filter to each of the one or more difference images, the digital filter including a convolution filter including one or more convolution filter coefficients; and adjust the one or more convolution filter coefficients of the applied digital filter using a machine learning classifier to generate an adjusted digital filter, the adjusted digital filter including one or more bias coefficients and one or more adjusted convolution filter coefficients configured to enhance defect detection of an inspection sub-system by enhancing defect signals and suppressing at least one of noise signals or nuisance signals, wherein the machine learning classifier is continuously trained in real-time during operation of the system using inspection data to further update the one or more adjusted convolution filter coefficients and the one or more bias coefficients to increase separation between the defect signals and at least one of the noise signals or the nuisance signals.

15. The system of claim 14, wherein the adjusting the applied digital filter using a machine learning classifier, the adjusted digital filter configured to enhance defect detection of the inspection sub-system comprises:

performing image segmentation on the generated one or more filtered images to identify two or more regions of interest, the two or more regions of interest including one of a defect of interest region or a noise region.

16. The system of claim 15, wherein the adjusting the applied digital filter using a machine learning classifier, the adjusted digital filter configured to enhance defect detection of the inspection sub-system comprises:

performing normalization on the generated one or more filtered images.

17. The system of claim 16, wherein the adjusting the applied digital filter using a machine learning classifier, the adjusted digital filter configured to enhance defect detection of the inspection sub-system comprises:

extracting one or more signals in the two or more regions of interest.

18. The system of claim 17, wherein the adjusting the applied digital filter using a machine learning classifier, the adjusted digital filter configured to enhance defect detection of the inspection sub-system comprises:

calculating a cost function based on the extracted one or more signals to classify the extracted one or more signals into two or more classes.

19. The system of claim 14, wherein the machine learning classifier comprises at least one of:

a deep learning classifier, a convolutional neural network (CNN), an ensemble learning classifier, a random forest classifier, or an artificial neural network.

20. A method, the method comprising:

acquiring two or more sample images, wherein one or more difference images are generated by calculating pixel-by-pixel differences between the two or more sample images acquired, the two or more sample images including two or more photomask images, the one or more difference images including defect data;

generating one or more filtered images by applying a digital filter to each of the one or more difference images, the digital filter including a convolution filter including one or more convolution filter coefficients; and adjusting the one or more convolution filter coefficients of the applied digital filter using a machine learning classifier to generate an adjusted digital filter, the adjusted digital filter including one or more bias coefficients and one or more adjusted convolution filter coefficients configured to enhance defect detection of an inspection system by enhancing defect signals and suppressing at least one of noise signals or nuisance signals, wherein the machine learning classifier is continuously trained in real-time during operation of the system using inspection data to further update one or more adjusted convolution filter coefficients and the one or more bias coefficients to increase separation between the defect signals and at least one of the noise signals or the nuisance signals.

* * * * *